United States Patent
Maki et al.

(10) Patent No.: US 10,063,135 B2
(45) Date of Patent: Aug. 28, 2018

(54) SEMICONDUCTOR INTEGRATED CIRCUIT FOR REGULATOR

(71) Applicants: Shinichiro Maki, Hiratsuka (JP); Yoichi Takano, Hadano (JP); Katsuhiro Yokoyama, Atsugi (JP)

(72) Inventors: Shinichiro Maki, Hiratsuka (JP); Yoichi Takano, Hadano (JP); Katsuhiro Yokoyama, Atsugi (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/721,364

(22) Filed: Sep. 29, 2017

(65) Prior Publication Data

US 2018/0097439 A1 Apr. 5, 2018

(30) Foreign Application Priority Data

Sep. 30, 2016 (JP) ................................. 2016-193092

(51) Int. Cl.
*H02M 1/32* (2007.01)
*H02M 3/156* (2006.01)
(Continued)

(52) U.S. Cl.
CPC ................ *H02M 1/32* (2013.01); *G05F 1/56* (2013.01); *H02M 3/156* (2013.01); *H02M 3/158* (2013.01);
(Continued)

(58) Field of Classification Search
CPC ...................................................... H02M 1/32
See application file for complete search history.

(56) References Cited

U.S. PATENT DOCUMENTS

| 9,645,593 | B2 | 5/2017 | Tsuzaki |
| 2013/0002220 | A1 | 1/2013 | Terada |

(Continued)

FOREIGN PATENT DOCUMENTS

| JP | 2012093296 A | 5/2012 |
| JP | 2013102603 A | 5/2013 |

(Continued)

OTHER PUBLICATIONS

Etended European Search Report (EESR) dated Feb. 9, 2018 in counterpart European Application No. 17193612.3.

*Primary Examiner* — Trinh Q Dang
(74) *Attorney, Agent, or Firm* — Holtz, Holtz & Volek PC

(57) ABSTRACT

A semiconductor integrated circuit for a regulator includes an opening error detecting circuit detecting an opened state of an output terminal; a short-circuiting error detecting circuit detecting a short-circuiting state thereof; a first output terminal outputting a result detected by the opening error detecting circuit to an external unit; a second output terminal outputting a result detected by the short-circuiting error detecting circuit thereto; and a thermal shutdown circuit detecting the temperature of a semiconductor substrate and turns off the voltage control transistor if the detected temperature of the semiconductor substrate exceeds a predetermined temperature. A signal indicating the logic sum of an output signal of the thermal shutdown circuit and that of the short-circuiting error detecting circuit is outputted from the second output terminal such that the output signal of the opening error detecting circuit is not blocked based on the output signal of the thermal shutdown circuit.

5 Claims, 6 Drawing Sheets

(51) Int. Cl.
*H02M 3/158* (2006.01)
*H03K 17/08* (2006.01)
*G05F 1/56* (2006.01)

(52) U.S. Cl.
CPC ....... *H03K 17/08* (2013.01); *H02M 2001/327* (2013.01); *H03K 2017/0806* (2013.01)

(56) References Cited

U.S. PATENT DOCUMENTS

| | | | |
|---|---|---|---|
| 2013/0016310 A1* | 1/2013 | Kanemitsu | H05B 33/0818 349/69 |
| 2014/0049238 A1* | 2/2014 | Hu | G01R 19/00 323/282 |
| 2014/0225577 A1* | 8/2014 | Ivanov | H02M 3/1582 323/225 |
| 2015/0256073 A1* | 9/2015 | Avalur | H02M 3/158 323/266 |
| 2016/0065061 A1* | 3/2016 | Tsyrganovich | H02M 3/156 323/312 |
| 2016/0111956 A1* | 4/2016 | Childs | H02M 3/156 323/271 |
| 2016/0266178 A1* | 9/2016 | Gerna | G01R 19/0092 |
| 2016/0334817 A1* | 11/2016 | Takano | G05F 1/468 |
| 2017/0302174 A1* | 10/2017 | Yan | H02M 3/157 |

FOREIGN PATENT DOCUMENTS

| | | |
|---|---|---|
| JP | 2015005171 A | 1/2015 |
| JP | 2016103140 A | 6/2016 |

\* cited by examiner

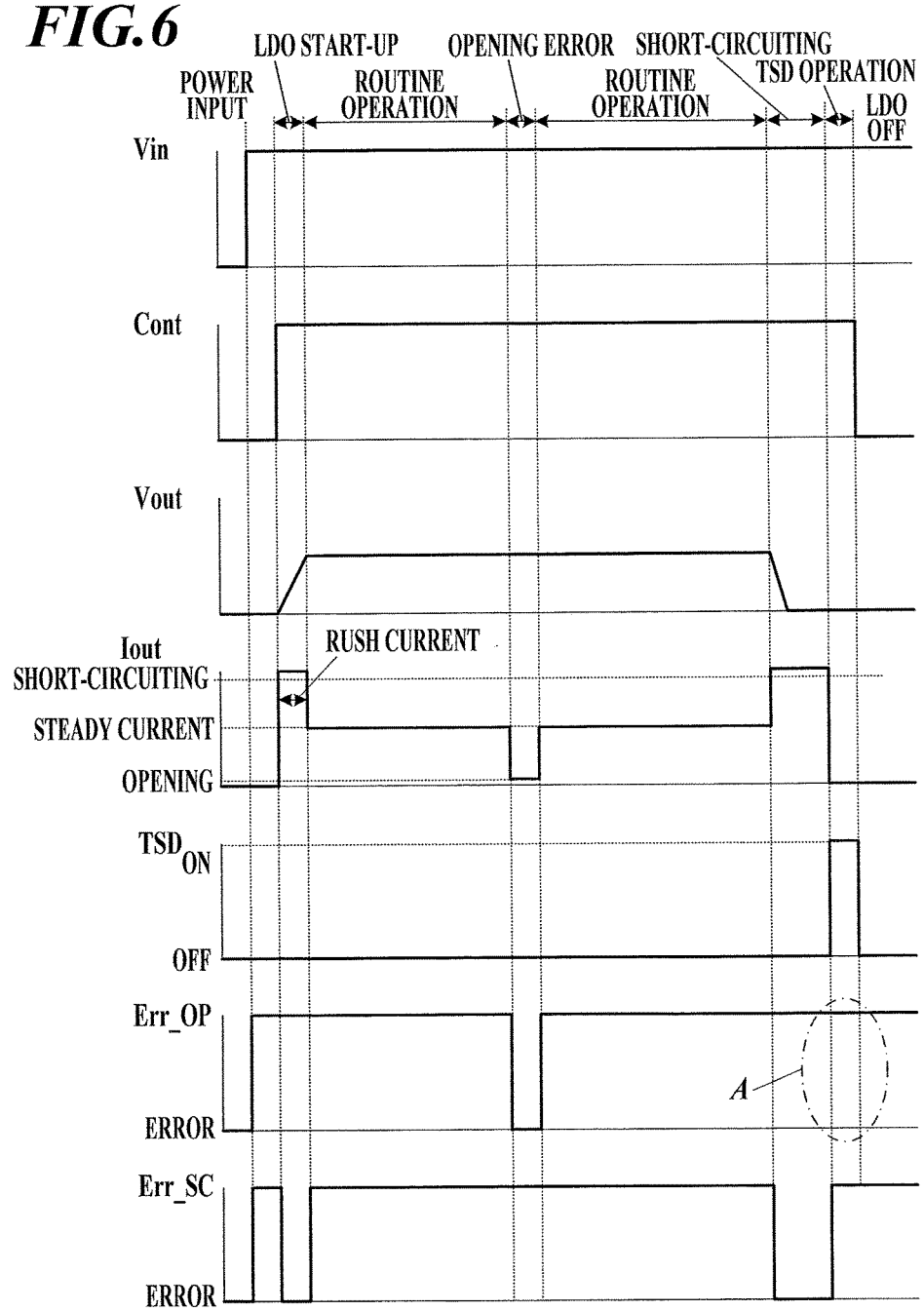

SEMICONDUCTOR INTEGRATED CIRCUIT FOR REGULATOR

CROSS-REFERENCE TO RELATED APPLICATIONS

This application is based upon and claims the benefit of priority from the prior Japanese Patent Application No. 2016-193092, filed on Sep. 30, 2016, the entire contents of which, including the specification, claims, drawings and abstract, are incorporated herein by reference.

BACKGROUND OF THE INVENTION

1. Field of the Invention

The present invention relates to a technique on a semiconductor integrated circuit (regulator IC) of a voltage regulator, such as a series regulator, for conversion of DC voltages. This technique is effectively applicable to DC power units.

2. Description of the Related Art

Series regulators (hereinafter, merely referred to as "regulators") are power supplies that output DC voltages having predetermined potentials through control of transistors connected to both DC voltage input terminals and output terminals. Such regulators are used as power supplies (in-vehicle regulators) for supplying DC power to in-vehicle electronic devices, such as car navigation systems, ETC systems, audio systems, and antennas.

In-vehicle regulators are usually connected to in-vehicle electric devices, such as car navigation systems, through connectors. Vibrations of a vehicle body may cause disconnection of a connector and open an output terminal of the power supply, and short-circuiting may occur inside an electric device functioning as a load. Thus, in-vehicle regulators must have a function that can detect such abnormal states. The regulators must also have a function that prevents overcurrent flowing in GPSs, VICSs (trademark), and radios not to damage these devices during connection of the reception antennas of the devices.

A regulator as shown in FIG. 5 is known that includes a current detecting resistor (sense resistor R1) connected to its input terminal and supplying a DC voltage from a battery via the sense resistor; and a microcomputer for control receiving the terminal voltage of the sense resistor and detecting opening and short-circuiting of the output terminal through software processing of the microcomputer (PTL1: Japanese Patent Application Laid-Open Publication No. 2012-93296).

A voltage regulator is also known that supplies a DC voltage from a battery through a sense resistor connected to the input terminal of the regulator and includes an overcurrent protecting circuit including an amplifier that amplifies the voltage across the terminals of the sense resistor and a comparator that compares the output of the amplifier with a reference voltage, the overcurrent protecting circuit being activated in response to short-circuiting of the output terminal to restrict a current through control of a transistor for output voltage control, to prevent an overcurrent (PTL 2: Japanese Patent Application Laid-Open Publication No. 2015-5171).

A semiconductor device is also disclosed that includes a thermal shutdown circuit and detects overheating of the circuit board to stop the operation of an internal power generating circuit (PTL 3: Japanese Patent Application Laid-Open Publication No. 2013-102603).

The regulator disclosed in PTL 1 detects an opening or short-circuiting of the output terminal of the regulator with the microcomputer. Thus, the microcomputer undergoes high load.

In either PTL 1 or 2, the sense resistor is connected to the input terminal of the regulator, and the current flowing to the output terminal is converted to a voltage, to detect an opening or short-circuiting of the load connected to the output terminal. Thus, the sense resistor generates an excess electrical loss.

Although regulator ICs including thermal shutdown circuits are known, regulator ICs including opening error detecting circuits or opening error detecting circuits and thermal shutdown circuits are not known.

The inventors of the present invention have studied a regulator IC including an opening error detecting circuit and a thermal shutdown circuit. As a result, it has been discovered that an opening error detecting circuit detecting an error through detection of a reduction in the output current is activated in response to a reduction in an output current due to activation of the thermal shutdown circuit, determines an opening error, and outputs a detection signal.

In such a case, a logic gate, such as an AND gate, is usually provided to block any detection signal of the opening error detecting circuit with an output of the activated thermal shutdown circuit such that a detection signal Err_OP of the opening error detecting circuit is not output (not output at a detectable level) during the output TSD of the thermal shutdown circuit (high-level period) (indicated by area A defined by a dash-dot line in FIG. 6), as illustrated in FIG. 6.

In the case where a regulator IC including a short-circuiting error detecting circuit is further provided with an opening error detecting circuit and a thermal shutdown circuit, external terminals that output signals of the circuits are usually provided to inform an external unit of the activation of the circuits. Unfortunately, this increases the number of external terminals and thereby the size of the chip.

SUMMARY OF THE INVENTION

An object of the present invention, which has been conceived in light of the issues described above, is to provide a semiconductor integrated circuit (regulator IC) of a DC power supply, such as a series regulator, including an error detecting circuit that detects an opened state of an output terminal, another error detecting circuit that detects a short-circuiting state, and a thermal shutdown circuit, the regulator IC outputting the operational states of the circuits to an external unit through a small number of external terminals, thereby preventing an increase in chip size.

Another object of the present invention is to provide a semiconductor integrated circuit (regulator IC) that can detect errors such as an opening or short-circuiting of a load connected to the output terminal without a sense resistor and select the current value for detection of errors, such as an opening or short-circuiting, of a load connected to the output terminal depending on the system to which the regulator IC is to be applied.

To achieve at least one of the above mentioned objects, according to an aspect of the present invention, there is provided a semiconductor integrated circuit for a regulator, including:

a voltage control transistor connected to both a voltage input terminal receiving a DC voltage and a voltage output terminal;

a control circuit controlling the voltage control transistor in response to a feedback voltage of an output;

an opening error detecting circuit detecting an opened state of the voltage output terminal;

a short-circuiting error detecting circuit detecting a short-circuiting state of the voltage output terminal;

a first output terminal outputting a result detected by the opening error detecting circuit to an external unit;

a second output terminal outputting a result detected by the short-circuiting error detecting circuit to the external unit; and a thermal shutdown circuit detecting the temperature of a semiconductor substrate including the semiconductor integrated circuit disposed thereon and allowing the control circuit to turn off the voltage control transistor if the detected temperature of the semiconductor substrate exceeds a predetermined temperature, wherein a signal indicating the logic sum of an output signal of the thermal shutdown circuit and an output signal of the short-circuiting error detecting circuit is outputted from the second output terminal such that the output signal of the opening error detecting circuit is not blocked based on the output signal of the thermal shutdown circuit.

The semiconductor integrated circuit for a regulator having the configuration described above detects the opened and short-circuiting states of the output terminals and outputs detection signals to an external unit, to reduce the load on the controller (CPU), such as a microcomputer controlling the system.

The semiconductor integrated circuit for a regulator outputs a signal indicating the logic sum of the output of the thermal shutdown circuit and the output of the short-circuiting error detecting circuit from the second output terminal as a short-circuiting error detection signal. Thus, multiple detection pulses can be prevented from interfering with the detection signal due to the alternating operations of detection and resetting of short-circuiting.

The semiconductor integrated circuit for a regulator has a smaller number of external terminals compared to the number of external terminals needed for separately outputting signals from the terminal shutdown circuit and the short-circuiting error detecting circuit.

The semiconductor integrated circuit for a regulator includes the first output terminal for outputting the result detected by the opening error detecting circuit to an external unit and is configured such that the output of the opening error detecting circuit is not blocked based on the output of the thermal shutdown circuit. Thus, the controller, such as a microcomputer (CPU), can determine whether a short-circuiting error detection signal rose due to an overcurrent that does not activate the thermal shutdown circuit or full short-circuiting.

Preferably, the semiconductor integrated circuit for a regulator includes:

a first transistor and a second transistor disposed in parallel with the voltage control transistor, a current scaled down in proportion to a current flowing in the voltage control transistor flowing in the first transistor and the second transistor, wherein, the opening error detecting circuit comprises a first voltage comparing circuit comparing in magnitude the voltage converted from the current flowing in the first transistor with a predetermined comparative voltage, the short-circuiting error detecting circuit comprises a second voltage comparing circuit comparing in magnitude the voltage converted from the current flowing in the second transistor with a predetermined comparative voltage, and if a current having a value smaller than the value of a predetermined opening error detection current flows in the first transistor, the output signal of the first voltage comparing circuit is inverted, and if a current having a value larger than the value of a predetermined short-circuiting error detection current flows in the second transistor, the output signal of the second voltage comparing circuit is inverted.

In such a configuration, opening and short-circuiting errors of a load connected to an output terminal is detected on the basis of a current proportional to the current flowing in the voltage control transistor, i.e., detected without a sense resistor for detecting the output current. Thus, opening errors can be more accurately detected than a configuration including a sense resistor having a low resistance connected to the input terminal.

Preferably, the semiconductor integrated circuit for a regulator includes:

a delay circuit delaying the output of at least the second voltage comparing circuit among the first voltage comparing circuit and the second voltage comparing circuit, wherein a signal indicating the logic product of the output signal of the second voltage comparing circuit and the signal delayed by the delay circuit is outputted from the second output terminal as a short-circuiting error detection signal.

In this way, a false output of a short-circuiting error detection signal due to a rush current flowing toward a capacitor connected to the output terminal at the start of operation can be prevented.

Preferably, the semiconductor integrated circuit for a regulator includes:

a first external terminal connected to a first current-to-voltage transducer for converting the current flowing in the first transistor to a voltage; and a second external terminal connected to a second current-to-voltage transducer for converting the current flowing in the second transistor to a voltage, wherein, the first voltage comparing circuit compares the voltage converted by the first current-to-voltage transducer connected to the first external terminal with a predetermined comparative voltage, and the second voltage comparing circuit compares the voltage converted by the second current-to-voltage transducer connected to the second external terminal with a predetermined comparative voltage.

In such a configuration, the current value to be the reference of an opening error and the current value to be the reference of a short-circuiting error can be arbitrarily and highly accurately determined in accordance with the system.

The semiconductor integrated circuit (regulator IC) of a DC power supply, such as a series regulator, according to the present invention includes an error detecting circuit that detects an opened state of an output terminal, another error detecting circuit that detects a short-circuiting state, and a thermal shutdown circuit. Such a regulator IC can output the operational states of the circuits to external unit (s) through a small number of external terminals, thereby preventing an increase in chip size. The regulator IC can detect errors such as an opening or short-circuiting of a load connected to the output terminal without a sense resistor and select the current value for detection of errors, such as an opening or short-circuiting, of a load connected to the output terminal in accordance with the system to which the regulator IC is to be applied.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein:

FIG. 6 is a timing chart illustrating usual variations in voltages at components of a series regulator IC having an opening detecting function, a short-circuiting detecting function, and a thermal shutdown function.

DESCRIPTION OF THE PREFERRED EMBODIMENTS

Embodiments of the present invention will now be described with reference to the accompanying drawings.

Figure 1:
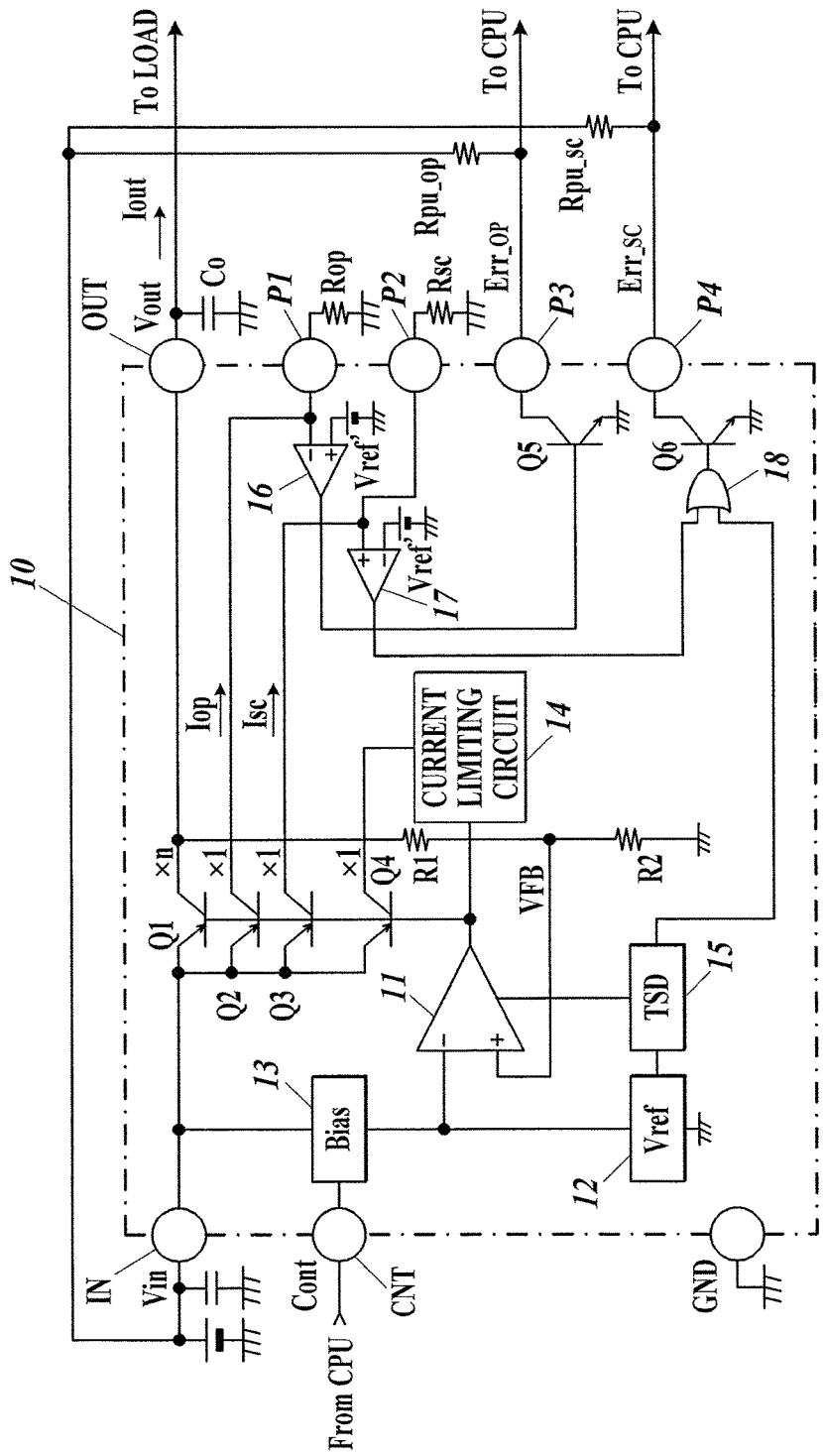
FIG. 1 is a circuit diagram of a series regulator IC according to an embodiment of the present invention.

FIG. 1 illustrates a series regulator or DC power supply according to an embodiment of the present invention. With reference to FIG. 1, the area defined by a dash-dot line indicates a semiconductor integrated circuit (regulator IC) 10 disposed on a semiconductor chip, such as a monocrystalline silicon chip. The regulator IC 10 has an output terminal OUT connected to a capacitor Co and functions as a DC power supply that supplies a stable DC voltage.

In the regulator IC 10 according to this embodiment, as illustrated in FIG. 1, a voltage control transistor Q1 consisting of PNP bipolar transistor is connected to both the voltage input terminal IN to which a DC voltage Vin is applied and the output terminal OUT, and bleeder resistors R1 and R2 that divide the output voltage Vout and are connected in series to both the output terminal OUT and the ground line to which the ground voltage GND is applied.

The voltage VFB divided by the bleeder resistors R1 and R2 is fed back to a non-inverting input terminal of an error amplifier 11 or error amplifier circuit that controls the base terminal of the voltage control transistor Q1. The error amplifier 11 controls the voltage control transistor Q1 in response to a potential difference between the outputted feedback voltage VFB and a reference voltage Vref, to produce a predetermined potential for the output voltage Vout.

The regulator IC 10 according to this embodiment includes a reference voltage circuit 12 that generates the reference voltage Vref to be applied to the inverting input terminal of the error amplifier 11; a bias circuit 13 that feeds an operational current to the error amplifier 11, the reference voltage circuit 12, and other components; a current limiting circuit 14 that is connected to the base terminal of the voltage control transistor Q1 to limit the output current; and a thermal shutdown circuit 15 that stops the operation of the error amplifier 11 and turns off the voltage control transistor Q1 if the temperature of the chip reaches a predetermined value.

The reference voltage circuit 12 includes, for example, a resistor and a Zener diode disposed in series. The bias circuit 13 supplies or blocks a bias current to the error amplifier 11 in response to the control signal Cont from a microcomputer (CPU) being an external unit outside the chip to an external terminal CNT. The current limiting circuit 14 limits the output current through clamping of a base current higher than a predetermined value when an increased output current due to, for example, an abnormal load decreases the output voltage, and, in response, the error amplifier 11 decreases the base voltage to increase the current flowing to the transistor Q1.

The regulator IC 10 according to this embodiment includes bipolar transistors Q2, Q3, and Q4 disposed in parallel with the voltage control transistor Q1. The bipolar transistors Q2, Q3, and Q4 and the voltage control transistor Q1 define a current mirror circuit. A voltage identical to that applied to the base terminal of the voltage control transistor Q1 is applied to the base terminals or control terminals of the transistor Q2 to Q4. This causes a current (1/N) proportional to the collector current of the transistor Q1 to flow in the transistors Q2 to Q4 in accordance with the size ratio N of the device. In the case where the transistor Q1 includes N transistors having the same dimensions disposed in parallel with and the transistors Q2 to Q4 each include a single transistor, a current is controlled to be proportional to the number of devices.

The regulator IC 10 according to this embodiment includes an external terminal P1 that is connected to a resistor Rop for current-to-voltage conversion at an external unit outside the chip and an external terminal P2 that is connected to a resistor Rsc. The collector terminal of the current mirror transistor Q2 is connected to the external terminal P1, and the collector terminal of the current mirror transistor Q3 is connected to the external terminal P2. The regulator IC 10 further includes a comparator 16 for detecting an opening error having an inverting input terminal connected to the external terminal P1 and a non-inverting input terminal receiving a reference voltage Vref'; and a comparator 17 for detecting a short-circuiting error having a non-inverting input terminal connected to the external terminal P2 and an inverting input terminal receiving the reference voltage Vref'.

The resistance of the external resistor Rop is determined such that the voltage across the terminals of the resistor is identical to the reference voltage Vref' while a detection current for an opening error of, for example, 10 mA flows in the voltage control transistor Q1. The resistance of the external resistor Rsc is determined such that the voltage across the terminals of the resistor is identical to the reference voltage Vref' while a detection current for a short-circuiting error of, for example, 200 mA flows in the voltage control transistor Q1.

In this embodiment, the external resistors Rop and Rsc determine the current values for the detection of an opening error and a short-circuiting error. Thus, the detection current (thresholds) can have any value in accordance with the system to be used, and the same reference voltage Vref' can be used for both the comparators 16 and 17, to simplify the circuit generating the reference voltage.

The regulator IC 10 according to this embodiment includes an NPN transistor Q5 having a base terminal connected to the output terminal of the comparator 16, an OR gate 18 that receives the output of the comparator 17 and the output of the thermal shutdown circuit 15, and an NPN transistor Q6 having a base terminal connected to the output terminal of the OR gate 18. The regulator IC chip includes external terminals P3 and P4 for an open-collector output of signals to an external unit, such as a CPU. The collector terminal of the transistor QS is connected to the external terminal P3, and the collector terminal of the transistor Q6 is connected to the external terminal P4.

Figure 2:
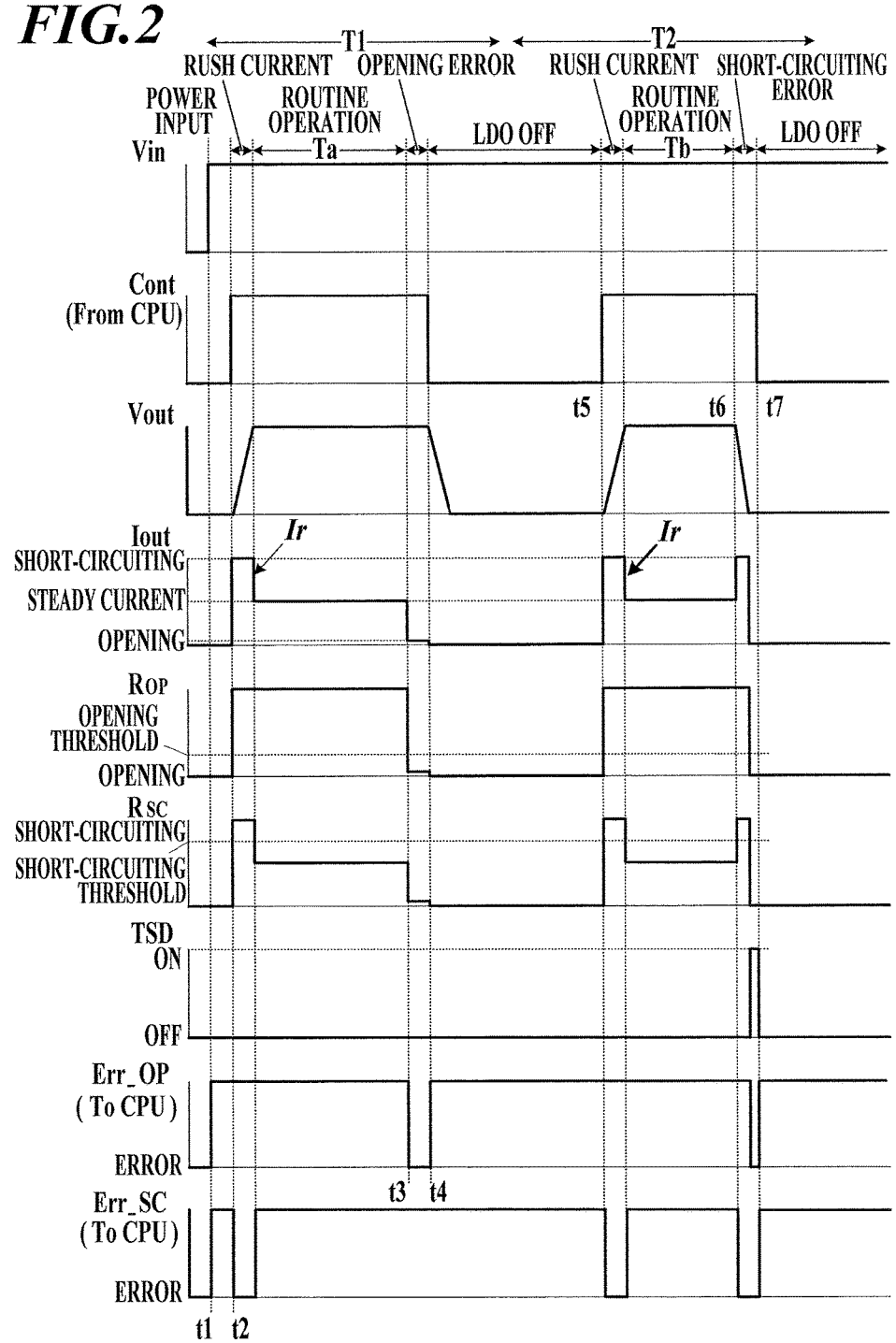
FIG. 2 is a timing chart illustrating variations in voltages at components of the regulator according to the embodiment illustrated in FIG. 1.

The operation of the regulator IC 10 according to this embodiment will now be explained with reference to the timing chart of FIG. 2. In FIG. 2, the period T1 on the left half indicates a certain time of routine operation after activation of the regulator and the timing of an opening after the routine operation, and the period T2 on the right half indicates a certain time of routine operation after activation of the regulator and the timing of short-circuiting after the routine operation.

As illustrated in FIG. 2, upon rising of an input voltage Vin at a timing t1 and then rising of a signal Cont of the control terminal CNT from an external unit to a high level at a timing t2, the regulator IC 10 is activated, and the output voltage Vout rises and is controlled to a predetermined voltage. A rush current flows toward the capacitor Co connected to the output terminal during the transitional period until the output voltage Vout rises, and then a steady current in accordance with the load status flows (period Ta).

If an error that causes the output terminal to open in the routine operation state, the output current Iout suddenly decreases (timing t3) In response, the current flowing in the current mirror transistor Q2 also decreases in a similar manner. The comparator 16 detects this decrease, and its output increases to a high level. As a result, the transistor Q5 turns on, and the signal Err-OP from the external terminal P3 decreases to a low level. The CPU receiving this signal can detect an opening error. Upon detection of an opening error, the CPU decreases the control signal Cont to a low level, to stop the operation of the regulator IC 10 (timing t4).

The elimination of the opening error state causes the control signal Cont to increase to a high level at a timing t5. The regulator IC 10 resumes operation and controls the output voltage Vout to rise to a predetermined voltage. Also at this time, a rush current flows during a transitional period until the output voltage Vout rises, and then a steady current in accordance with the load status flows (period Tb).

If shot-circuiting occurs in a load in the routine operation state, the output current Iout suddenly increases (timing t6). In response, the current flowing in the current mirror transistor Q3 also increases in a similar manner. The comparator 17 detects this increase, and its output increases to a high level. As a result, the transistor Q6 turns on, and the signal Err-SC from the external terminal P4 decreases to a low level. The CPU receiving this signal can detect a short-circuiting error.

For a short-circuiting error, the output current Iout suddenly increases and generates a high electrical power as heat. The thermal shutdown circuit blocks the output Iout because the operation of the error amplifier 11 is stopped to turn off the transistor Q1 if the temperature of the chip reaches a predetermined temperature. As a result, the detection of the short-circuiting state is reset. A decrease in the temperature of the semiconductor chip due to radiation of heat cancels the shutdown. If the short-circuiting state continues, the short-circuiting state is detected and is output. Such operations are repeated, generating a faulty short-circuiting error detection signal.

Thus, the regulator IC 10 according to this embodiment includes the OR gate 18, which determines the logic sum of the output of the comparator 17 and the output of the thermal shutdown circuit 15. The output of the OR gate 18 turns on/off the transistor Q6. If a short-circuiting error occurs and the output current Iout suddenly increases, a short-circuiting error detection signal is output and causes an increase in the temperature of the chip. During the period in which the output of the thermal shutdown circuit detects a high temperature, the transistor Q6 is turned on or off by the logic sum of the output of the comparator 17 and the output of the thermal shutdown circuit 15 to continue the short-circuiting error detection signal. In this way, the short-circuiting error detection signal of the regulator IC 10 can be prevented from being generated through such repeated operation described above. Upon detection of a short-circuiting error by the CPU, the control signal Cont decreases to a low level to stop the operation of the regulator IC 10 (timing t7).

As described above, in the regulator IC 10 according to this embodiment, a rush current flows immediately after the regulator IC 10 is activated. The rush current increases the output of the comparator 17 to a high level to turn on the transistor Q6 and decreases the signal Err-SC to a low level. Such false detection of the signal can be corrected by the CPU, which receives the signal, through execution of a dead-band program for ignoring a pulsed signal for detection of short-circuiting immediately after power is turned on.

In a regulator IC including the thermal shutdown circuit 15 and the opening error detecting circuit (comparator 16), such as the regulator IC 10 according to this embodiment, the operation of the thermal shutdown circuit 15 turns off the voltage control transistor Q1 and the current mirror transistor Q2, and the output of the comparator 16 is inverted to output an opening error detection signal Err_OP. Thus, the external microcomputer (CPU) receiving the signal may erroneously detect an opening error.

Thus, the IC illustrated in FIG. 1 includes a logic gate, such as an AND gate, that blocks the detection signal of the opening error detecting circuit (comparator 16) with the output of the activated thermal shutdown circuit 15; and an inverter that inverts the output of the thermal shutdown circuit 15. The IC having a configuration in which the output of the inverter is applied to one of the input terminals of the AND gate usually does not output a detection signal Err_OP of the opening error detecting circuit while the output TSD of the thermal shutdown circuit rises (high level period), as illustrated in FIG. 6 (refer to the area A defined by the dot-dash line in FIG. 6). The output of the thermal shutdown circuit 15 and the detection signal of the short-circuiting error detecting circuit (comparator 17) are usually output from separate external terminals. The detection signal Err_SC in FIG. 6 indicates the signal timing in such configuration.

In contrast, the regulator IC 10 according to this embodiment outputs a signal Err_SC of the logic sum of the output of the thermal shutdown circuit 15 and the detection signal of the short-circuiting error detecting circuit (17), from the external terminal P4. Thus, the number of external terminals can be reduced in comparison with that in a regulator IC that separately generates the output of the thermal shutdown circuit 15 and the detection signal of the short-circuiting error detecting circuit (17). In the case of a relatively low detection level of a short-circuiting error, an overcurrent small enough not to activate the thermal shutdown circuit 15 flows, or a relatively large current flows due to short-circuiting of a load and causes an increase in the temperature of the chip, thereby activating the thermal shutdown circuit 15. In such a case, if the output of the thermal shutdown circuit 15 and the detection signal of the short-circuiting error detecting circuit (17) are outputted from a single external terminal P4, the external microcomputer (CPU) cannot determine whether the detection signal Err_SC rose due to activation of the thermal shutdown circuit 15 or due to detection of an overcurrent that does not activate the thermal shutdown circuit 15 by the short-circuiting error detecting circuit (17).

In contrast, the external microcomputer (CPU) of the regulator IC according this embodiment outputs a detection signal Err_OP if the opening error detecting circuit (16) detects an opening error even during rising of the output TSD of the thermal shutdown circuit 15 (high level period), as illustrated in the timing chart of FIG. 2. Thus, the external microcomputer (CPU) can determine whether the detection signal Err_SC rises due to an overcurrent that does not activate the thermal shutdown circuit 15 or due to full short-circuiting.

In this embodiment, full short-circuiting causes activation of the thermal shutdown circuit 15 always after rising of the short-circuiting error detection signal Err_SC, to vary the opening error detection signal Err_OP. Thus, the external microcomputer (CPU) can distinguish between an accidental overcurrent and full short-circuiting through monitoring of the signal Err_SC of the external terminal P4 and the signal Err_OP of the external terminal P3. Thus, different processes can be carried out in response to detection of a predetermined overcurrent and detection of high heat due to operation of the thermal shutdown circuit, as indicated by the period between timings t6 and t7 in FIG. 2. As a result, a false operation, such as turning off the regulator due to misidentifying an accidental overcurrent as full short-circuiting, can be prevented.

(Modification)

A regulator IC according to a modification of this embodiment will now be described with reference to FIGS. 3 and 4.

Figure 3:
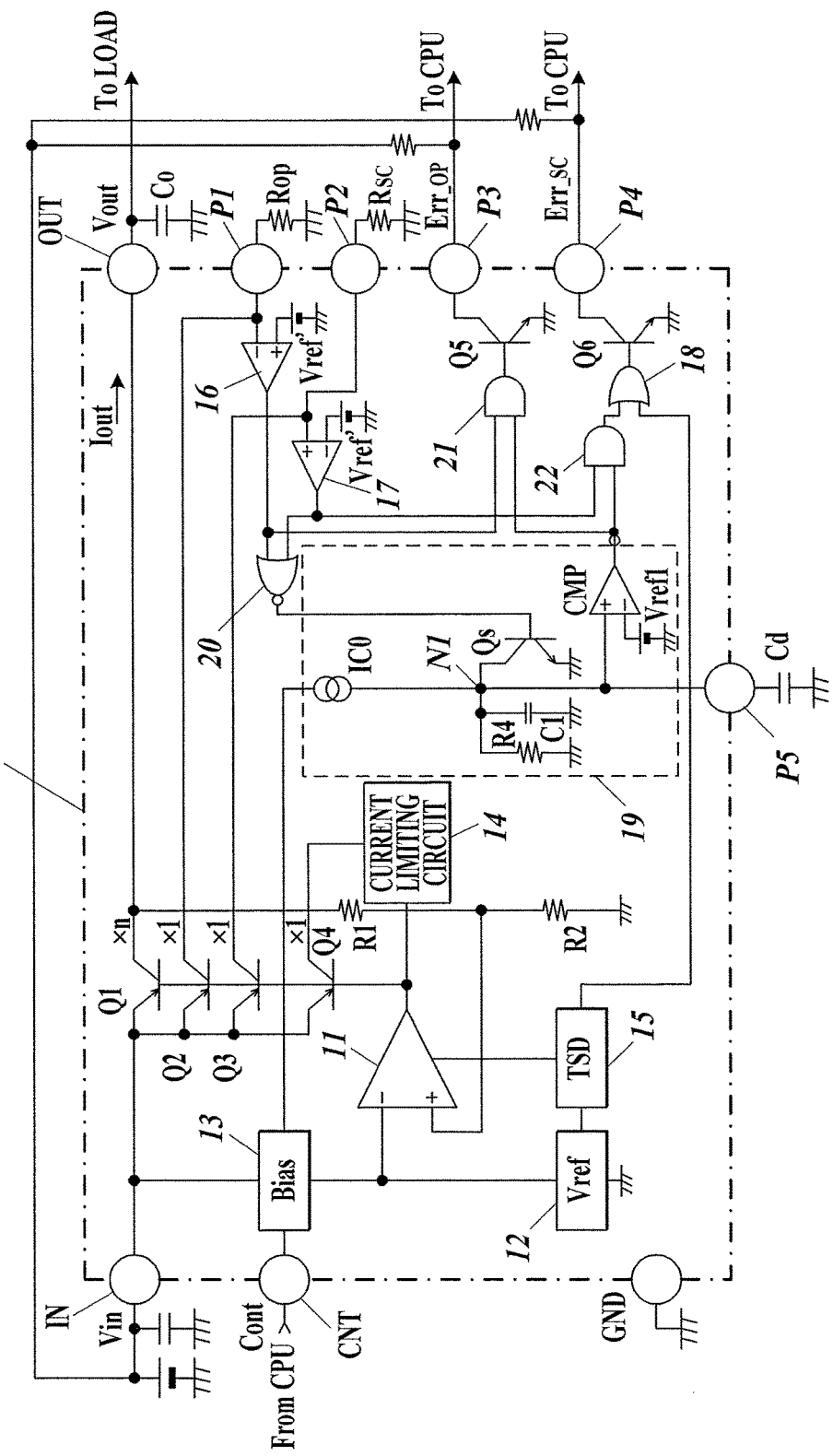
FIG. 3 is a circuit diagram illustrating a regulator according to a first modification of the embodiment illustrated in FIG. 1.

FIG. 3 illustrates a regulator IC according to a first modification. The regulator IC 10 according to this modification includes a delay circuit 19 including a resistor and a capacitor that delay the outputs of the comparators 16 and 17, a NOR gate 20 that determines the logic sum of the outputs of the comparators 16 and 17 and outputs the logic sum to the delay circuit 19, and AND gates 21 and 22 that determine the logic product of the output of the delay circuit 19 and the outputs of the comparators 16 and 17 before delay.

The regulator IC according to this embodiment determines a short-circuiting state when a relatively large current flows toward the output terminals. At startup of the IC, a relatively large rush current flows toward the capacitor Co of the output terminal. The regulator IC illustrated in FIG. 1 cannot distinguish between such a rush current and a current that flows toward an output terminal during a short-circuiting error. Thus, a false detection pulse generated in response to detection of a rush current Ir inevitably interferes with the output of the comparator 17, as illustrated in the timing chart in FIG. 2.

In contrast, the system including the regulator IC according to this modification does not generate a false detection signal even if a rush current is detected. In this way, a dead-band program is not required for the downstream CPU.

In specific, the delay circuit 19 includes a constant current source IC0, a capacitor C1 charged by the constant current source IC0, a resistor R4 and a switch transistor Qs connected in series to both the connection node N1 of the constant current source IC0 and the capacitor C1 and a ground point, and a comparator CMP. The base terminal of the transistor Qs receives an output voltage of the NOR gate 20. The delay circuit 19 further includes an external terminal P5 connected to the connection node N1. The external terminal P5 is connected to an external capacitor Cd to increase the delay time without an increased chip size.

In a normal operational state of the delay circuit 19 in which the outputs of the comparators 16 and 17 are at a low level, the base terminal of the transistor Qs is turned on by a high-level output of the NOR gate 20, and the capacitors C1 and Cd are in a discharge state. If an opened state of the comparator 16 or a short-circuiting state of the comparator 17 is detected and the output of one of the comparators increases to a high-level, the output of the NOR gate 20 decreases to a low level to turn off the transistor Qs.

The capacitors C1 and Cd are gradually charged, and the potential of the connection node N1 gradually increases. When the potential of the connection node N1 exceeds the reference voltage Vref1 of the comparator CMP after a predetermined time, the output of the comparator CMP varies from a low level to a high level. Thus, during detection of an opened state, the output of the AND gate 21 increases to a high level to turn on the transistor Q5, and the output of the external terminal P3 varies from the high level to a low level.

During detection of a short-circuiting error, the output of the AND gate 22 increases to a high level to turn on the transistor Q6, and the output of the external terminal P4 varies from a high level to a low level. The delay time of the delay circuit 19 is controlled to be slightly longer than the period during which the rush current Ir illustrated in FIG. 2 flows.

The delay circuit 19, the comparator CMP, and the AND gates 21 and 22 according to this modification prevent the generation of a false detection pulse in response to detection of a rush current.

FIG. 3 illustrates a configuration in which the delay circuit 19 delays the outputs of the comparators 16 and 17. Alternatively, only the output of the comparator 17 for detecting a short-circuiting error may be delayed. In such a case, the NOR gate 20 and the AND gate 21 in FIG. 3 are omitted.

Figure 4:
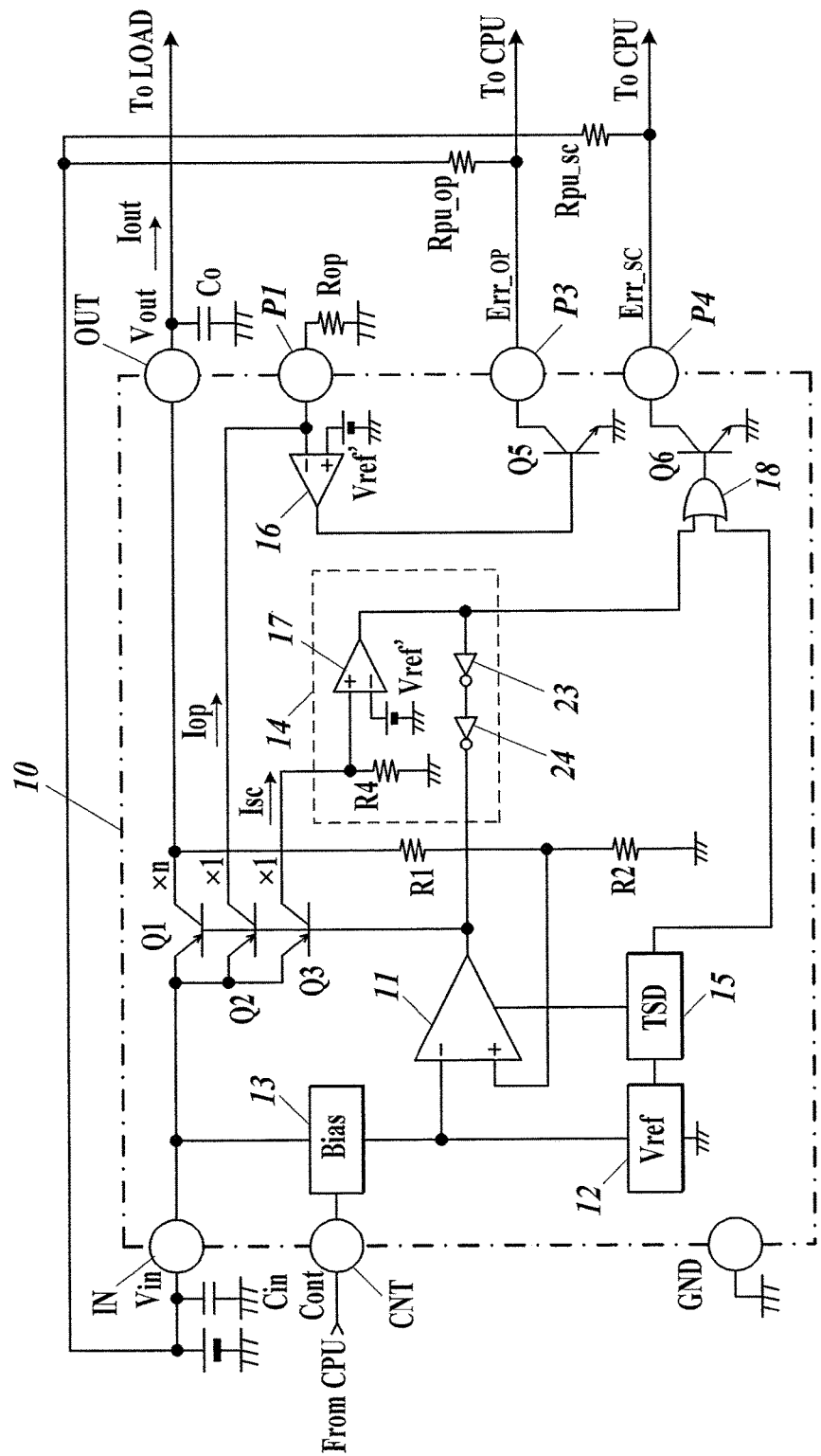
FIG. 4 is a circuit diagram illustrating a regulator according to a second modification of the embodiment illustrated in FIG. 1.
Figure 5:
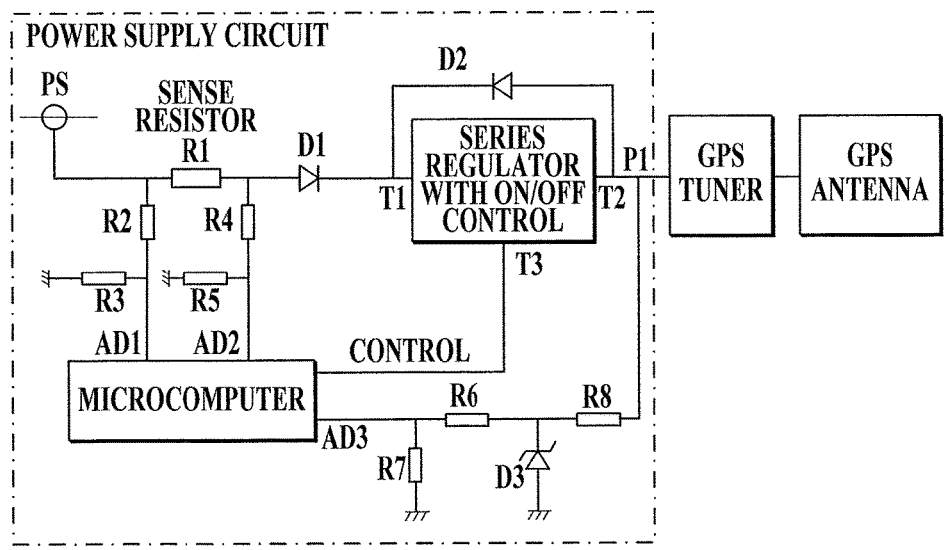
FIG. 5 is a diagram illustrating an example configuration of a known power supply having an opening detecting function and a short-circuiting detecting function.

FIG. 4 illustrates a regulator IC according to a second modification. In this modification, the comparator 17 for detecting a short-circuiting error according to the embodiment illustrated in FIG. 1 also functions as a comparator of the current limiting circuit 14. Thus, the current mirror transistor Q3 that feeds a monitoring current for detecting a short-circuiting error can also function as the current mirror transistor Q4 generating a monitoring current of the current limiting circuit 14.

In specific, the current mirror transistor Q4 and the external terminal P2 in FIG. 1 are omitted, and an internal resistor R4 that converts the current of the current mirror transistor Q3 to a voltage is provided. The voltage converted by the internal resistor R4 is inputted to a non-inverting input terminal of the comparator 17 for detecting a short-circuiting error. The output of the comparator 17 and the output of the thermal shutdown circuit 15 are inputted to the base terminal of the transistor Q6 for output via the OR gate 18.

The output of the comparator 17 is applied to the base terminals of the voltage control transistor Q1 and the current mirror transistors Q2 and Q3 via inverters 23 and 24. If a current having a value larger than a predetermined current value flows in the voltage control transistor Q1, the voltage control transistor Q1 is clamped to limit the output current Iout.

The regulator IC according to the second modification has one less external terminal compared with the external terminals in the regulator IC according to the embodiment illustrated in FIG. 1, and the short-circuiting error detecting circuit can function as a current limiting circuit. Thus, the chip can have reduced dimensions.

Alternatively, the comparator 17 for detecting a short-circuiting error can function as the comparator of the current limiting circuit 14 while the external terminal P2 may be provided to connect an external resistor R4 for adjustment of the detection current (threshold).

The present invention made by the inventors has been described in detail through the embodiments. However, the embodiments should not be construed to limit the scope of the invention. For example, in the embodiment described above, the voltage control transistor Q1 and the current mirror transistors Q2 to Q4 are bipolar transistors. Besides bipolar transistors, MOSFETs may also be used.

In the embodiment described above, the bleeder resistors R1 and R2 that divide the output voltages are disposed inside the chip. Alternatively, a dividing circuit including an external resistor may be provided to feed the voltage divided outside the chip from an external terminal to the error amplifier 11.

A DC power supply including the series regulator according to the embodiments described above may be effectively used for in-vehicle electronic devices, such as car navigation systems, ETC systems, audio systems, and antennas. Besides such in-vehicle electronic devices, the DC power supply including the series regulator according to the embodiments described above may also be used in any system having loads activated by DC power.

What is claimed is:

1. A semiconductor integrated circuit for a regulator, comprising:
   a voltage control transistor connected to both a voltage input terminal receiving a DC voltage and a voltage output terminal;
   a control circuit controlling the voltage control transistor in response to a feedback voltage of an output;
   an opening error detecting circuit detecting an opened state of the voltage output terminal;
   a short-circuiting error detecting circuit detecting a short-circuiting state of the voltage output terminal;
   a first output terminal outputting a result detected by the opening error detecting circuit to an external unit;
   a second output terminal outputting a result detected by the short-circuiting error detecting circuit to the external unit; and
   a thermal shutdown circuit detecting the temperature of a semiconductor substrate including the semiconductor integrated circuit disposed thereon and allowing the control circuit to turn off the voltage control transistor if the detected temperature of the semiconductor substrate exceeds a predetermined temperature,
   wherein a signal indicating the logic sum of an output signal of the thermal shutdown circuit and an output signal of the short-circuiting error detecting circuit is outputted from the second output terminal such that the output signal of the opening error detecting circuit is not blocked based on the output signal of the thermal shutdown circuit.

2. The semiconductor integrated circuit for a regulator according to claim 1, comprising:
   a first transistor and a second transistor disposed in parallel with the voltage control transistor, a current scaled down in proportion to a current flowing in the voltage control transistor flowing in the first transistor and the second transistor, wherein,
   the opening error detecting circuit comprises a first voltage comparing circuit comparing in magnitude the voltage converted from the current flowing in the first transistor with a predetermined comparative voltage,
   the short-circuiting error detecting circuit comprises a second voltage comparing circuit comparing in magnitude the voltage converted from the current flowing in the second transistor with a predetermined comparative voltage, and
   if a current having a value smaller than the value of a predetermined opening error detection current flows in the first transistor, the output signal of the first voltage comparing circuit is inverted, and if a current having a value larger than the value of a predetermined short-circuiting error detection current flows in the second transistor, the output signal of the second voltage comparing circuit is inverted.

3. The semiconductor integrated circuit for a regulator according to claim 2, comprising:
   a delay circuit delaying the output of at least the second voltage comparing circuit among the first voltage comparing circuit and the second voltage comparing circuit,
   wherein a signal indicating the logic product of the output signal of the second voltage comparing circuit and the signal delayed by the delay circuit is outputted from the second output terminal as a short-circuiting error detection signal.

4. The semiconductor integrated circuit for a regulator, according to claim 2, comprising:
   a first external terminal connected to a first current-to-voltage transducer for converting the current flowing in the first transistor to a voltage; and
   a second external terminal connected to a second current-to-voltage transducer for converting the current flowing in the second transistor to a voltage, wherein,
   the first voltage comparing circuit compares the voltage converted by the first current-to-voltage transducer connected to the first external terminal with a predetermined comparative voltage, and
   the second voltage comparing circuit compares the voltage converted by the second current-to-voltage transducer connected to the second external terminal with a predetermined comparative voltage.

5. The semiconductor integrated circuit for a regulator, according to claim 3, comprising:
   a first external terminal connected to a first current-to-voltage transducer for converting the current flowing in the first transistor to a voltage; and
   a second external terminal connected to a second current-to-voltage transducer for converting the current flowing in the second transistor to a voltage, wherein,
   the first voltage comparing circuit compares the voltage converted by the first current-to-voltage transducer connected to the first external terminal with a predetermined comparative voltage, and
   the second voltage comparing circuit compares the voltage converted by the second current-to-voltage transducer connected to the second external terminal with a predetermined comparative voltage.

* * * * *